United States Patent
Gaume et al.

(10) Patent No.: US 11,791,429 B2
(45) Date of Patent: Oct. 17, 2023

(54) LIGHTWEIGHT AND FLEXIBLE PHOTOVOLTAIC MODULE COMPRISING A FRONT LAYER CONSISTING OF A POLYMER AND A REAR LAYER CONSISTING OF A COMPOSITE MATERIAL

(71) Applicant: COMMISSARIAT A L'ENERGIE ATOMIQUE ET AUX ENERGIES ALTERNATIVES, Paris (FR)

(72) Inventors: Julien Gaume, Grenoble (FR); Thomas Guerin, Grenoble (FR); Yannick Veschetti, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/056,271

(22) PCT Filed: May 16, 2019

(86) PCT No.: PCT/FR2019/051114
§ 371 (c)(1),
(2) Date: Nov. 17, 2020

(87) PCT Pub. No.: WO2019/224458
PCT Pub. Date: Nov. 28, 2019

(65) Prior Publication Data
US 2021/0249549 A1   Aug. 12, 2021

(30) Foreign Application Priority Data

May 22, 2018 (FR) ..................... 18 54260

(51) Int. Cl.
*H01L 31/0203* (2014.01)
*H01L 31/048* (2014.01)
(Continued)

(52) U.S. Cl.
CPC ........... *H01L 31/0481* (2013.01); *B32B 7/12* (2013.01); *B32B 9/045* (2013.01); *C08J 5/244* (2021.05);
(Continued)

(58) Field of Classification Search
CPC ....... H01L 31/00–078; Y02E 10/50–60; H02S 30/00–20
(Continued)

(56) References Cited

U.S. PATENT DOCUMENTS 4,478,879 A    10/1984  Baraona et al.
5,582,653 A *  12/1996  Kataoka ................ H01L 31/056
                                                                    136/251
(Continued)

FOREIGN PATENT DOCUMENTS

CN    105322039    *  2/2016
CN    105322039 B    12/2017
(Continued)

OTHER PUBLICATIONS

CN105322039 English translation (Year: 2016).*
(Continued)

*Primary Examiner* — Bach T Dinh
(74) *Attorney, Agent, or Firm* — Oblon, McClelland, Maier & Neustadt, L.L.P.

(57) ABSTRACT

The invention relates to a lightweight photovoltaic module (1) comprising: a transparent first layer (2) forming the front face, photovoltaic cells (4), an assembly (3) encapsulating the photovoltaic cells (4), and a second layer (5), the encapsulating assembly (3) and the photovoltaic cells (4) being arranged between the first (2) and the second (5) layer. The invention is characterised in that the first layer (2) comprises a polymer material and has a thickness (e2) of less than 50 μm, in that the second layer (5) comprises at least
(Continued)

one composite material of the prepreg type containing polymer resin and fibres and has a areal weight of less than 150 g/m², and in that the encapsulating assembly (3) has a maximum thickness (e3) of less than 150 µm.

11 Claims, 3 Drawing Sheets

(51) Int. Cl.
    *C08J 5/24*     (2006.01)
    *B32B 7/12*     (2006.01)
    *B32B 9/04*     (2006.01)
    *H01L 31/18*     (2006.01)

(52) U.S. Cl.
    CPC ........ *H01L 31/18* (2013.01); *B32B 2307/732* (2013.01); *B32B 2457/12* (2013.01); *C08J 2363/00* (2013.01)

(58) Field of Classification Search
    USPC .................................................. 136/243–265
    See application file for complete search history.

(56) References Cited

U.S. PATENT DOCUMENTS

| | | | |
|---|---|---|---|
| 5,726,104 A * | 3/1998 | Hannawacker | E04C 2/54 52/DIG. 17 |
| 6,294,724 B1 * | 9/2001 | Sasaoka | H02S 20/25 438/66 |
| 2007/0012353 A1 | 1/2007 | Fischer et al. | |
| 2010/0065116 A1 | 3/2010 | Stancel et al. | |
| 2013/0284234 A1 | 10/2013 | Funayama et al. | |
| 2014/0000681 A1 * | 1/2014 | Zhao | B32B 27/322 427/398.1 |
| 2014/0060623 A1 * | 3/2014 | Naitou | B32B 27/20 156/244.11 |
| 2015/0114451 A1 * | 4/2015 | Anderson | H01L 31/049 136/251 |
| 2016/0254404 A1 * | 9/2016 | Dries | H01L 31/048 136/251 |
| 2017/0213925 A1 | 7/2017 | Gaume et al. | |
| 2017/0213926 A1 | 7/2017 | Gaume et al. | |
| 2019/0036375 A1 * | 1/2019 | Wang | H02J 7/35 |
| 2019/0229225 A1 * | 7/2019 | Dinelli | H01L 31/048 |

FOREIGN PATENT DOCUMENTS

| | | |
|---|---|---|
| EP | 2 623 314 A1 | 8/2013 |
| EP | 2 660 876 A1 | 11/2013 |
| FR | 2 955 051 A1 | 7/2011 |
| WO | WO 2008/019229 A2 | 2/2008 |
| WO | WO 2010/019829 A1 | 2/2010 |
| WO | WO 2012/140585 A1 | 10/2012 |
| WO | WO 2018/060611 A1 | 4/2018 |

OTHER PUBLICATIONS

U.S. Appl. No. 15/328,337, filed Jan. 23, 2017, US 2017/0213926 A1, Gaume et al.
U.S. Appl. No. 15/328,303, filed Jan. 23, 2017, US 2017/0213925 A1, Gaume et al.
U.S. Appl. No. 15/329,060, filed Jan. 25, 2017, US 2017/0222078 A1, Hidalgo et al.
U.S. Pat. No. 10,546,966 B2, Jan. 28, 2020, Gaume et al.
U.S. Pat. No. 7,670,937 B2, Mar. 2, 2010, Veschetti et al.
International Search Report dated Sep. 9, 2019 in PCT/FR2019/051114 filed on May 16, 2019, 2 pages.
Preliminary French Search Report dated Mar. 8, 2019 in French Application No. 1854260 filed on May 22, 2018, 1 page.

* cited by examiner

LIGHTWEIGHT AND FLEXIBLE PHOTOVOLTAIC MODULE COMPRISING A FRONT LAYER CONSISTING OF A POLYMER AND A REAR LAYER CONSISTING OF A COMPOSITE MATERIAL

TECHNICAL FIELD

The present invention relates to the field of photovoltaic modules, which include an assembly of photovoltaic cells electrically connected to each other, and preferentially so-called "crystalline", that is single crystal or multicrystalline silicon based photovoltaic cells.

The invention can be implemented for numerous applications, for example standalone and/or onboard applications, being particularly concerned by applications requiring the use of flexible, glass-free and ultra-light photovoltaic modules, in particular with a weight per unit area lower than 1 kg/m$^2$, and especially lower than 800 g/m$^2$, or even lower than 600 g/m$^2$, and with a small thickness, especially lower than 1 mm. It can thus especially be applied for buildings such as housing or industrial premises (tertiary, commercial, . . . ), for example for making their roofs, for designing street furniture, for example for public lighting, road signing or else charging electric vehicles, or even also be used for nomad applications, in particular for being integrated into cars, buses or boats, inter alia.

The invention thus provides an ultra-light and flexible photovoltaic module including a first layer forming the front face of the module, of a polymeric material, and a second layer, of a composite material, as well as a method for making such a photovoltaic module.

STATE OF PRIOR ART

A photovoltaic module is an assembly of photovoltaic cells disposed side by side between a first transparent layer forming a front face of the photovoltaic module and a second layer forming a rear face of the photovoltaic module.

The first layer forming the front face of the photovoltaic module is advantageously transparent to enable the photovoltaic cells to receive a luminous flux. It is traditionally made of a single glass plate, having a thickness typically between 2 and 4 mm, conventionally in the order of 3 mm.

The second layer forming the rear face of the photovoltaic module can in turn be made based on glass, metal or plastic, inter alia. It is often formed by a polymeric structure based on an electrically insulating polymer, for example of the polyethylene terephthalate (PET) or polyamide (PA) type, which can be protected by one or more layers based on fluorinated polymers, such as polyvinyl fluoride (PVF) or polyvinylidene fluoride (PVDF), and having a thickness in the order of 400 µm.

Photovoltaic cells can be electrically connected to each other by front and rear electric contact elements, called connecting cables, and for example formed by tinned copper strips, respectively disposed against the front faces (faces facing the front face of the photovoltaic module for receiving a luminous flux) and rear faces (faces facing the rear face of the photovoltaic module) of each of the photovoltaic cells, or even only at the rear face for the IBC (for "Interdigitated Back Contact") type photovoltaic cells.

It is to be noted that IBC ("Interdigitated Back Contact") type photovoltaic cells are structures for which contacts are made on the rear face of the cell in the form of interdigitated combs. They are for example described in U.S. Pat. No. 4,478,879 A.

Furthermore, the photovoltaic cells, located between the first and second layers respectively forming the front and rear faces of the photovoltaic module, can be encapsulated. Conventionally, the selected encapsulant corresponds to an elastomer-type polymer (or rubber), and can for example consist in using two poly(ethylene-vinyl acetate) (EVA) layers (or films) between which the photovoltaic cells and connecting cables of the cells are disposed. Each encapsulant layer can have a thickness of at least 0.2 mm and a Young's modulus typically between 2 and 400 MPa at room temperature.

Figure 1:
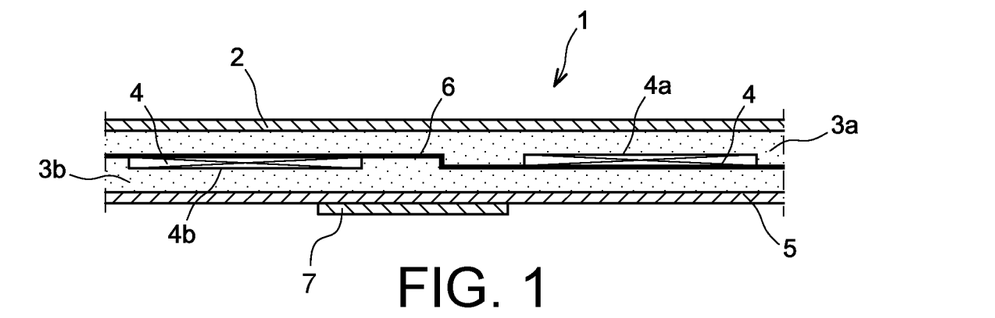
FIG. 1 represents, in a cross-section view, a conventional example of photovoltaic module including crystalline photovoltaic cells.
Figure 2:
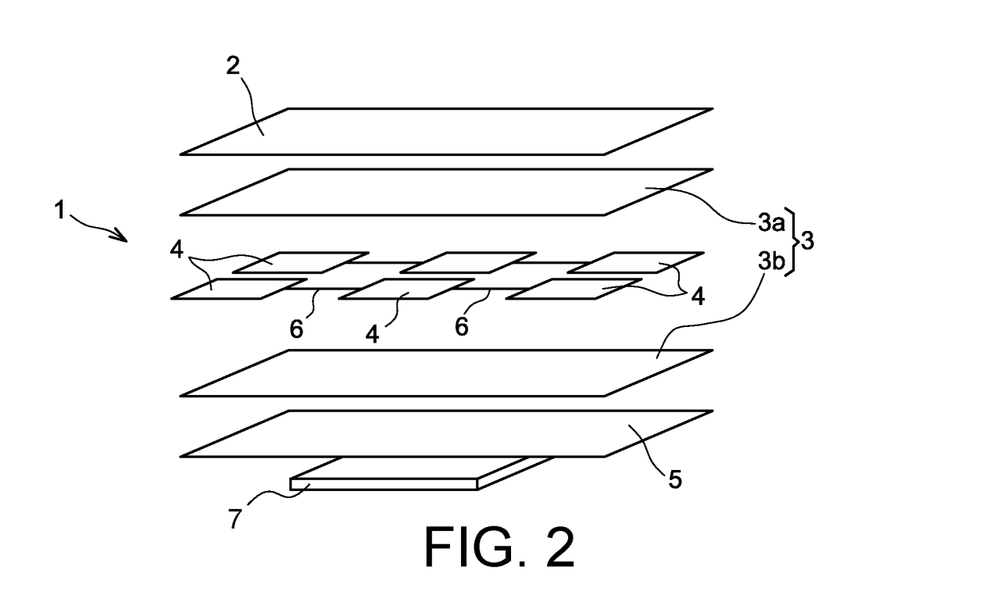
FIG. 2 represents, in an exploded view, the photovoltaic module of FIG. 1.

A conventional example of photovoltaic module 1 including crystalline photovoltaic cells 4 is partially schematically represented, in a cross-section view in FIG. 1 and in an exploded view in FIG. 2, respectively.

As previously described, the photovoltaic module 1 includes a front face 2, generally made of transparent tempered glass with a thickness of about 3 mm, and a rear face 5, for example consisting of an opaque or transparent, single layer or multilayer polymeric sheet, having a Young's modulus greater than 400 MPa at room temperature.

Between the front 2 and rear 5 faces of the photovoltaic module 1 photovoltaic cells 4 are located, electrically connected to each other by connecting cables 6 and dipped between two front 3a and rear 3b encapsulation material layers both forming an encapsulant assembly 3.

Figure 1A:
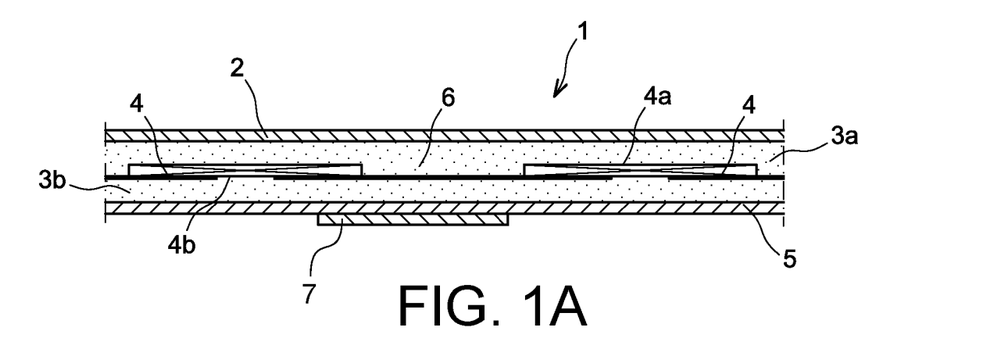
FIG. 1A represents an alternative embodiment of the example of FIG. 1 in which photovoltaic cells are of the IBC-type.

FIG. 1A further represents an alternative embodiment of the example of FIG. 1 in which photovoltaic cells 4 are of the IBC-type, the connecting cables 6 being only disposed against the rear faces of the photovoltaic cells 4.

Furthermore, FIGS. 1 and 2 also represent the junction box 7 of the photovoltaic module 1, for receiving wiring necessary to operate the module. Conventionally, this junction box 7 is made of plastic or rubber, and has full impermeability.

Usually, the method for making the photovoltaic module 1 includes a so-called step of vacuum laminating the different layers previously described, at a temperature greater than or equal to 120° C., or even 140° C., still even 150° C., and lower than or equal to 170° C., typically between 145 and 160° C., and for a time period of the lamination cycle of at least 10 minutes, or even 15 minutes.

During this lamination step, the encapsulation material layers 3a and 3b melt and embed the photovoltaic cells 4, at the same time as adhesion is created at all interfaces between the layers, namely between the front face 2 and the encapsulation material front layer 3a, the encapsulation material layer 3a and the front faces 4a of the photovoltaic cells 4, the rear faces 4b of the photovoltaic cells 4 and the encapsulation material rear layer 3b, and the encapsulation material rear layer 3b and the rear face 5 of the photovoltaic module 1. The photovoltaic module 1 obtained is then framed, typically through an aluminium profile.

Such a structure has now become a standard which has a large mechanical strength by the use of a front face 2 of thick glass and the aluminium frame, especially and in most cases allowing it to comply with IEC 61215 and IEC 61730 standards.

Nevertheless, such a photovoltaic module 1 according to the conventional design of prior art has the drawback of having a heavy weight, in particular a weight per unit area of about 12 kg/m$^2$, and is thereby not adapted for some applications for which lightweight is a priority.

This heavy weight of the photovoltaic module 1 is mainly due to the presence of thick glass, with a thickness of about 3 mm, to form the front face 2, the density of glass being indeed high, in the order of 2.5 kg/m$^2$/mm thickness, and of the aluminium frame. To be able to withstand stresses upon manufacturing and also for safety reasons, for example because of the cutting risk, glass is tempered. But, industrial infrastructure of thermal tempering is configured to process glass with a thickness of at least 3 mm. Further, selecting a glass thickness of about 3 mm is also related to a mechanical strength at the standard pressure of 5.4 kPa. Finally, glass on its own makes up nearly 70% of the weight of the photovoltaic module 1, and more than 80% with the aluminium frame around the photovoltaic module 1.

Thus, in order to obtain a significant decrease in the weight of a photovoltaic module to enable its use in new demanding applications in terms of lightweight and shaping, there is a need for an alternative solution to the use of a thick glass at the front face of the module. One of the problems is therefore to replace the glass front face with new plastic materials while keeping usual architecture and implementation method with the primary purpose of largely decreasing the weight per unit area.

Thus, sheets of polymers, like polycarbonate (PC), polymethyl methacrylate (PMMA), polyvinylidene fluoride (PVDF), ethylene tetrafluoroethylene (ETFE), ethylene chlorotrifluoroethylene (ECTFE), or fluorinated ethylene propylene (FEP), can be alternatives to glass. However, when only replacing glass with such a thin polymeric sheet is contemplated, the photovoltaic cell becomes highly prone to impact and mechanical load.

Replacing glass at the front face of photovoltaic modules has been the subject-matter of several patents or patent applications in prior art. In this respect French patent application FR 2 955 051 A1, US patent application 2005/0178428 A1 or international applications WO 2008/019229 A2 and WO 2012/140585 A1 can thus be mentioned.

The lightweight and flexible photovoltaic modules obtained, have a weight per unit area, typically lower than or equal to 6 kg/m², much lower than that of photovoltaic modules conventionally made with thick glass at the front face. However, their weight per unit area only rarely reaches a weight per unit area lower than 1 kg/m².

DISCLOSURE OF THE INVENTION

There is thus a need for designing an alternative solution of photovoltaic module provided to be flexible and ultra-light in order to adapt to some applications, while having sufficient mechanical properties enabling it to resist to impacts and mechanical load, and in particular complying with IEC 61215 and IEC 61730 standards.

The purpose of the invention is therefore to at least partially overcome the previously mentioned needs and drawbacks relating to embodiments of prior art.

One object of the invention, according to one of its aspects, is a photovoltaic module including:
 a first transparent layer forming the front face of the photovoltaic module, for receiving a luminous flux,
 a plurality of photovoltaic cells disposed side by side and electrically connected to each other,
 an assembly encapsulating the plurality of photovoltaic cells,
 a second layer, the encapsulant assembly and the plurality of photovoltaic cells being located between the first and second layers.

The first layer includes at least one polymeric material and has a thickness lower than 50 μm, and advantageously between 5 μm and 25 μm. It advantageously consists of said at least one polymeric material.

Moreover, the second layer includes at least one polymeric resin and fibres-based pre-preg-type composite material, and it has a weight per unit area lower than 150 g/m², and advantageously between 50 g/m² and 115 g/m². It can for example consist of said at least one composite material.

Furthermore, the encapsulant assembly has a maximum thickness lower than 150 μm.

The photovoltaic module can further include an additional layer, forming the rear face of the photovoltaic module, the second layer being located between the additional layer and the encapsulant assembly.

The additional layer can consist of the same material as that making up the first layer forming the front face of the photovoltaic module, this material being preferentially ethylene chlorotrifluoroethylene (ECTFE), also known as Halar®.

Preferably, the additional layer can have a thickness lower than or equal to that of the first layer.

The additional layer can advantageously enable a module to be dielectrically insulated.

Thus, advantageously, the principle of the invention especially consists both in replacing the standard thick glass with a thickness of about 3 mm, usually used in a conventional photovoltaic module, with a first thinner layer of polymeric material, and in modifying the rear face of the photovoltaic module to provide the presence of a polymer/fibres pre-preg-type composite material.

It is to be noted that the first layer and/or second layer of the photovoltaic module can be formed in one or more parts, namely they can be single-layer or multi-layer.

The term "transparent" means that the material of the first layer forming the front face of the photovoltaic module is at least partially transparent to visible light, allowing at least about 80% of this light to pass through.

Further, by "encapsulating" or "encapsulated", it should be understood that the plurality of photovoltaic cells is disposed into a volume, for example hermetically sealed with respect to liquids, at least partly formed by at least two encapsulating material layers, joined to each other after lamination to form the encapsulant assembly.

Indeed, initially, that is before any lamination operation, the encapsulant assembly consists of at least two encapsulation material layers, called core layers, between which the plurality of photovoltaic cells is encapsulated. However, during the operation of laminating the layers, the layers of encapsulation material melt to form, after the lamination operation, only one solidified layer (or assembly) in which photovoltaic cells are embedded.

By virtue of the invention, it can thus be possible to obtain a new type of ultra-light and flexible photovoltaic module. Moreover, by the use of a front face of polymer with a thickness lower than 50 μm, the photovoltaic module according to the invention keeps electric performance identical, or even better than that of a standard module. Moreover, by the use of a rear face of polymer/fibres pre-preg composite, the photovoltaic module according to the invention has excellent mechanical and thermomechanical properties while keeping flexibility without degrading flexurally stressed photovoltaic cells. Especially, it can support curvature radii of about 50 cm, or even 20 cm in some cases, without degrading the cells. Further, especially by decreasing thicknesses of its constituent elements, the photovoltaic module according to the invention can make it possible to reach required weight per unit areas lower than 1 kg/m², especially lower than 800 g/m², and more particularly lower than 600 g/m², making it ultra-light by definition.

The photovoltaic module according to the invention can further include one or more of the following characteristics taken alone or according to any possible technical combinations.

The second layer can form the rear face of the photovoltaic module. However, it can also be interposed between the encapsulant assembly and at least one further layer, for example a protective layer, which will thereby form the rear face of the module.

The second layer can in particular have a thickness between 50 μm and 80 μm.

The second layer can be discontinuous so as to further decrease the weight per unit area related to this layer while keeping mechanical properties of the photovoltaic module. In particular, the second layer can include one or more holes, especially corresponding to one or more stock removal parts, especially formed at one or more photovoltaic cells. In case of discontinuity, the total surface coverage of the second layer is preferentially greater than 30%.

Said at least one pre-preg-type composite material can include a polymeric resin impregnation rate between 30 and 70 mass %.

Said at least one composite material of the second layer can be a polymeric resin and fibres-based pre-preg, the polymer being selected from polyester, epoxy and/or acrylic, inter alia, and the fibres being selected from glass, carbon and/or aramid fibres, inter alia.

Said at least one polymeric material of the first layer can be selected from: polycarbonate (PC), polymethyl methacrylate (PMMA), polyethylene terephthalate (PET), polyamide (PA), a fluorinated polymer, especially polyvinyl fluoride (PVF) or polyvinylidene fluoride (PVDF), ethylene tetrafluoroethylene (ETFE), ethylene chlorotrifluoroethylene (ECTFE), polytetrafluoroethylene (PTFE), polychlorotrifluoroethylene (PCTFE) and/or fluorinated ethylene propylene (FEP).

Furthermore, the photovoltaic module advantageously has a weight per unit area lower than 1 kg/m$^2$, especially lower than 800 g/m$^2$, especially even lower than 600 g/m$^2$.

Moreover, the encapsulant assembly can have a maximum thickness between 20 μm and 100 μm, and preferably between 50 μm and 75 μm.

The encapsulant assembly can be formed by at least one layer including at least one polymer type encapsulation material selected from: acid copolymers, ionomers, poly(ethylene-vinyl acetate) (EVA), vinyl acetals, such as polyvinylbutyrals (PVB), polyurethanes, polyvinyl chlorides, polyethylenes, such as low density linear polyethylenes, copolymer elastomer polyolefins, α-olefin and α,β-ethylenic carboxylic acid ester copolymers, such as ethylene-methyl acrylate copolymers and ethylene-butyl acrylate copolymers, silicone elastomers and/or epoxy resins, inter alia.

Preferably, the encapsulant assembly can be made from two layers of polymeric material, especially two layers of ionomer, the Young's modulus of which is much greater than that of poly(ethylene-vinyl acetate) (EVA) but always between 2 and 400 MPa at room temperature allowing better mechanical properties, between which the photovoltaic cells are disposed, each layer having a thickness lower than 75 μm, and preferably lower than 50 μm.

The photovoltaic cells can be selected from: single-crystal (c-Si) and/or multi-crystalline (mc-Si)-based homojunction or heterojunction photovoltaic cells, and/or IBC (Interdigitated Back Contact)-type photovoltaic cells, and/or photovoltaic cells comprising at least one material from amorphous silicon (a-Si), microcrystalline silicon (μC-Si), cadmium telluride (CdTe), copper-indium selenide (CIS) and copper-indium/gallium diselenide (CIGS), inter alia.

Furthermore, the photovoltaic cells can have a thickness between 1 and 300 μm, especially between 1 and 200 μm, and advantageously between 70 μm and 160 μm.

The photovoltaic module can further include a junction box, for receiving wiring necessary to operate the photovoltaic module.

Furthermore, spacing between two neighbouring, or consecutive or adjacent, photovoltaic cells, can be greater than or equal to 1 mm, especially between 1 and 30 mm, and preferably equal to 2 mm.

Moreover, the thickness of interconnecting strip(s) of the photovoltaic cells, and those used to interconnect cell strings, has been adapted to be compatible with the lamination method and small thickness of the encapsulant. For example, in the case of cells with front face-rear face contact, the thickness of interconnecting strips of such cells is advantageously decreased by at least 50% relative to that of strips used in a standard module. Interconnecting strips of such cells can have a thickness lower than 100 μm and a width lower than 3 mm. For string interconnecting strips, thickness is advantageously strictly lower than 200 μm and the width lower than 5 mm.

Moreover, the photovoltaic module can include electronic components such as bypass diodes, inside the photovoltaic laminate.

Moreover, one further object of the invention, according to another of its aspects, is a method for making a photovoltaic module such as previously defined, characterised in that it includes the step of hot laminating, at a temperature between 130° C. and 170° C., especially in the order of 150° C., and for a time period of the lamination cycle of at least 10 minutes, especially between 10 and 20 minutes, the constituent layers of the photovoltaic module.

Moreover, the method can include the step of laminating the constituent layers of the photovoltaic module between two anti-adhesive damping layers.

The photovoltaic module and making method according to the invention can include any of the characteristics previously set forth, taken alone or according to any technically possible combinations with other characteristics.

BRIEF DESCRIPTION OF THE DRAWINGS

The invention can be better understood upon reading the following detailed description, of examples of non-limiting implementation thereof, as well as upon examining schematic and partial figures, of the appended drawing, in which.

Throughout these figures, identical references can refer to identical or analogous elements.

Moreover, the different parts represented in the figures are not necessarily drawn to a uniform scale, to make figures more legible.

DETAILED DISCLOSURE OF PARTICULAR EMBODIMENTS

FIGS. 1 and 2 have already been described in the part relating to the state of prior art.

Figure 3:
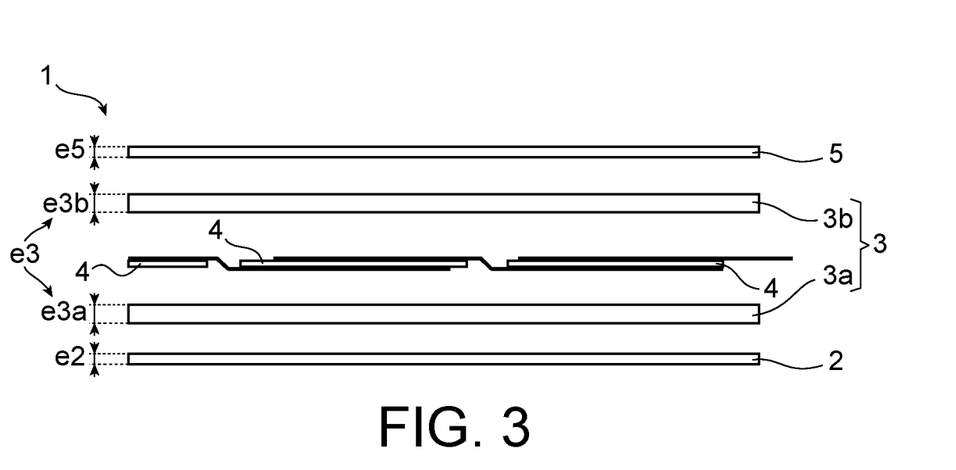
FIG. 3 illustrates, in a cross-section exploded view, an example of embodiment of a photovoltaic module in accordance with the invention.
Figure 4:
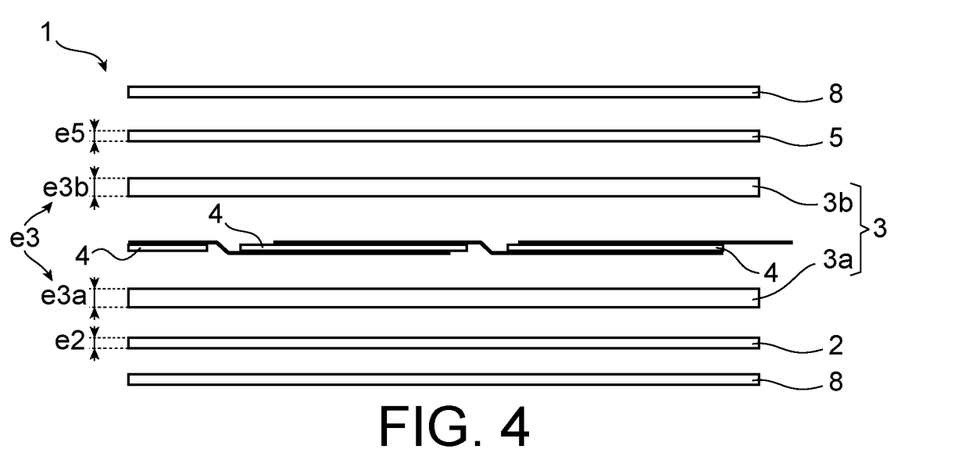
FIG. 4 illustrates, in a cross-section exploded view, a configuration of a photovoltaic module in accordance with the invention during a step of manufacturing the module.

FIGS. 3 and 4 illustrate, in cross-section and exploded views, embodiments of photovoltaic modules 1 in accordance with the invention.

It is here considered that the photovoltaic cells 4, interconnected by welded tinned copper strips, are "crystalline" cells, that is they include single crystal or multi-crystalline silicon, and that they have a thickness between 1 and 250 µm.

Moreover, the encapsulant assembly 3 is selected to be made from two layers of ionomer between which the photovoltaic cells 4 are disposed, each layer having a thickness lower than 50 µm.

Advantageously, the invention provides a specific choice for materials forming the front and rear faces of the photovoltaic module 1, so as to obtain an ultra-light photovoltaic module 1, with a weight per unit area lower than 1 kg/m$^2$, and preferentially lower than 0.8 kg/m$^2$, or even 0.6 kg/m$^2$.

Of course, these choices are in no way limiting.

FIG. 3 is first referred to, which illustrates, in a cross-section exploded view, an example of embodiment of a photovoltaic module 1 in accordance with the invention.

It is to be noted that FIG. 3 corresponds to an exploded view of the photovoltaic module 1 before the lamination step of the method according to the invention. Once the lamination step is performed, ensuring hot vacuum pressing, the different layers are in fact superimposed over each other.

The photovoltaic module 1 thus includes a first layer 2 of a film of at least one polymeric material, with a thickness e2 lower than 50 µm, forming the front face of the photovoltaic module 1 and for receiving a luminous flux, a plurality of photovoltaic cells 4 disposed side by side and electrically connected to each other, and an assembly 3 encapsulating the plurality of photovoltaic cells 4.

The polymeric material of the first layer 2 can be selected from: polycarbonate (PC), polymethyl methacrylate (PMMA), polyethylene terephthalate (PET), polyamide (PA), a fluorinated polymer, especially polyvinyl fluoride (PVF) or polyvinylidene fluoride (PVDF), ethylene tetrafluoroethylene (ETFE), ethylene chlorotrifluoroethylene (ECTFE), polytetrafluoroethylene (PTFE), polychlorotrifluoroethylene (PCTFE) and/or fluorinated ethylene propylene (FEP).

Furthermore, whereas the rear face of a traditional photovoltaic module conventionally consists of a polymer multi-layer stack of the Tedlar®/polyethylene terephthalate (PET)/Tedlar® (or TPT) type with a thickness in the order of 300 µm, the photovoltaic module 1 includes a second layer 5 forming the rear face of the photovoltaic module 1, consisting of a polymer/continuous fibres pre-preg-type composite material with a total base weight lower than 150 g/m$^2$. Moreover, the cloth weft of the pre-preg has a thickness lower than 50 µm, and the polymeric resin impregnation rate is between 30 and 70 mass %.

The composite material of the second layer 5 can be a polymeric resin and fibres based pre-preg, the polymer being selected from polyester, epoxy and/or acrylic, and the fibres being selected from glass, carbon and/or aramid fibres.

The second layer 5 can have a thickness e5 between 50 µm and 80 µm.

Furthermore, the encapsulant assembly 3 has a total thickness e3 which is lower than 150 µm, and preferentially between 20 and 100 µm.

The encapsulant assembly 3 can be made from at least one polymeric material selected from: acid copolymers, ionomers, poly(ethylene-vinyl acetate) (EVA), vinyl acetals, such as polyvinylbutyrals (PVB), polyurethanes, polyvinyl chlorides, polyethylenes, such as low density linear polyethylenes, copolymer elastomer polyolefins, α-olefin and α,β-ethylenic carboxylic acid ester copolymers, such as ethylene-methyl acrylate copolymers and ethylene-butyl acrylate copolymers, silicone elastomers and/or epoxy resins. It can especially be made from two polymer layers 3a and 3b, especially two poly(ethylene-vinyl acetate) (EVA) layers, between which the photovoltaic cells 4 are disposed. Each layer 3a, 3b can have a thickness e3a, e3b lower than 50 µm.

Furthermore, the photovoltaic cells 4 can be selected from: single-crystal (c-Si) and/or multi-crystalline (mc-Si)-based homojunction or heterojunction photovoltaic cells, and/or IBC-type photovoltaic cells, and/or photovoltaic cells comprising at least one material from amorphous silicon (a-Si), microcrystalline silicon (µC-Si), cadmium telluride (CdTe), copper-indium selenide (CIS) and copper-indium/gallium diselenide (CIGS). Their thickness is between 1 and 300 µm, and especially between 1 and 200 µm.

Making the photovoltaic module 1 is performed in a single step of hot laminating, at a temperature between 130° C. and 170° C., and especially in the order of 150° C., and for a time period of the lamination cycle of at least 10 minutes, and especially between 10 and 20 minutes, the constituent layers 2, 3, 4, 5 forming the stack of the photovoltaic module 1.

However, given the small thickness of the encapsulant assembly 3, it is desirable to be able to laminate this stack between two anti-adhesive damping sheets; compatible with the hot lamination method; in order to avoid any breakage of the photovoltaic cells during the pressing step, this breakage being related to excessive thickness of copper strips on the photovoltaic cells 4.

Thus, FIG. 4 represents a configuration analogous to that of FIG. 3 of a photovoltaic module 1 but with the presence of two anti-adhesive damping layers 8 on either side of the stack to avoid any breakage of the photovoltaic cells 4.

Figure 5:
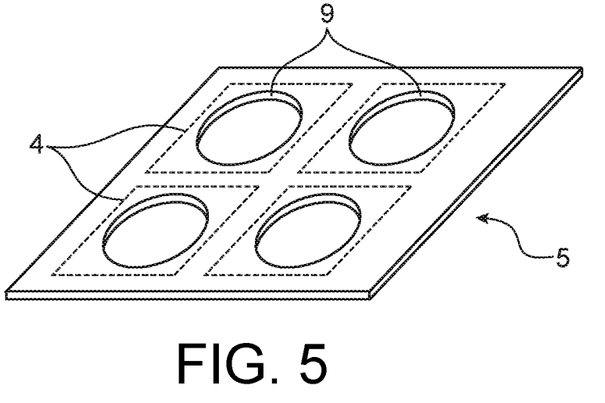
FIG. 5 illustrates, in a partial bottom view, an alternative embodiment of the second layer of a photovoltaic module in accordance with the invention.

Furthermore, FIG. 5 illustrates, in a partial bottom view, an alternative embodiment of the second layer 5 of a photovoltaic module 1 in accordance with the invention.

This alternative illustrates the fact that the second layer 5, as a pre-preg, can be discontinuous so as to further decrease the weight per unit area related to this layer 5 while keeping the mechanical properties of the photovoltaic module 1.

Thus, the second layer 5 includes stock removal parts forming holes 9 located at the photovoltaic cells 4. This stock removal is made under the photovoltaic cells 4, represented in dotted lines, which correspond to zones where mechanical strength is already ensured by these cells 4. In other words, the material of the pre-preg formed by the second layer 5 is removed under the cells 4 but kept between the cells 4 and on the edges of the layer 5.

Examples of Particular Embodiments

Two examples of particular embodiments A and B of photovoltaic modules 1 in accordance to the invention will now be described.

Both examples A and B have been made with the same encapsulation materials but with different photovoltaic cells:
- in the first example A, the photovoltaic cells 4 comprise 24 amorphous single-crystal silicon based heterojunction cells with a thickness in the order of 115 µm.
- In the second example B, the photovoltaic cells 4 comprise 30 IBC-type cells with a thickness in the order of 160 µm.

Furthermore, for these two examples A and B, the constituent layers are the following ones:
- the first layer 2 forming the front face is an ECT 025 type ethylene chlorotrifluoroethylene (ECTFE) film from the Rayotec company, with a thickness in the order of 25 µm.
- The encapsulant layers 3a and 3b are films of ionomer obtained from the Jurasol series marketed by the Juraplast company, with a thickness in the order of 50 µm.
- The second layer 5 forming the rear face is a pre-preg composite film of the epoxy resin impregnated glass cloth type such as Hexply M77 from the Hexcel company.

For each example A and B, the photovoltaic module is implemented in a single hot vacuum lamination step. During this step, it is desirable to properly cure the rear face formed by the second layer 5 in order to obtain desired mechanical properties. Thus, the hot lamination program has been optimised (temperature, pressure, time period, . . . ) in order to obtain sufficient curing of the composite material without any visual defect, nor breakage of the photovoltaic cells 4. This cross-linking is checked by measuring glass transition through Differential Scanning Calorimetry (DSC).

Moreover, as previously described with reference to FIG. 4, in order to avoid breakage of the photovoltaic cells 4, the photovoltaic module 1 is laminated between two anti-adhesive damping sheets 8, with a thickness in the order of 0.50 mm.

For both examples of embodiments A and B, photovoltaic modules 1 with a weight per unit area of less than 800 g/m$^2$ and a light output of more than 180 W/m$^2$ are advantageously obtained.

Furthermore, advantageously, for these two embodiments A and B, electroluminescence imaging after implementation showed no degradation in the photovoltaic cells 4, even after flexure or bending of less than 50 cm, which thus confirmed the compatibility of the new materials used with a conventional hot lamination method for the manufacture of photovoltaic modules 1. The electrical performance of the photovoltaic modules 1 is identical, or even better, than its equivalents in the standard configuration by virtue of the better optical transparency of the materials used.

In addition, accelerated ageing resistances in a thermal cycling chamber according to the terrestrial standard IEC 61215 have been demonstrated over more than 600 cycles.

Figure 6:
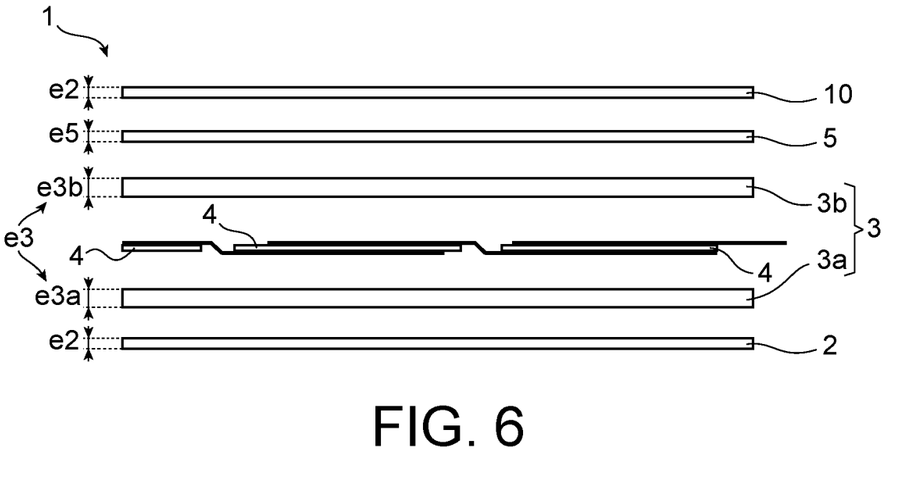
FIG. 6 illustrates, in a cross-section exploded view, an alternative embodiment in accordance with the invention of the photovoltaic module of FIG. 3.

In addition, FIG. 6 shows an alternative embodiment in accordance with the invention to the photovoltaic module 1 of FIG. 3.

This module in FIG. 6 can include all the characteristics described above, in particular those in connection with FIG. 3 to 5, which will therefore not be described again.

However, in this example, the photovoltaic module 1 has an additional layer 10 forming the back side of the photovoltaic module 1, with the second layer 5 located between the additional layer 10 and the encapsulant assembly 3.

This additional layer 10 is made of the same material as the first layer 2 forming the front side of the photovoltaic module 1. Advantageously, this material corresponds to ethylene chlorotrifluoroethylene (ECTFE), also known as Halar®.

In addition, the additional layer 10 has a thickness which in this example in FIG. 6 is less than or equal to the thickness e2 of the first layer 2. The additional layer 10 advantageously provides an advantageous dielectric insulation to the module 1.

Of course, the invention is not limited to the exemplary embodiments just described. Various modifications can be made thereto by those skilled in the art.

The invention claimed is:

1. A photovoltaic module, comprising:
   - a first transparent layer forming a front face of the photovoltaic module, for receiving a luminous flux;
   - a plurality of photovoltaic cells disposed side by side and electrically connected to each other;
   - an encapsulant assembly encapsulating the plurality of photovoltaic cells,
   - a second layer, wherein the encapsulant assembly and the plurality of photovoltaic cells is located between the first and second layers, and the first transparent layer comprises at least one polymeric material and has a thickness lower than 50 µm; and
   - an additional layer forming a rear face of the photovoltaic module, the second layer being located between the additional layer and the encapsulant assembly, wherein
   - the second layer comprises at least one polymeric resin and fibers based-pre-preg-type composite material having a weight per unit area lower than 150 g/m$^2$,
   - the encapsulant assembly has a maximum thickness lower than 150 µm,
   - the additional layer consists of a same material as that making up the first layer forming the front face of the photovoltaic module,
   - the additional layer has a thickness lower than or equal to that of the first layer,
   - the second layer includes a plurality of holes, each hole is circular and formed under a center of a corresponding one of the photovoltaic cells, and
   - a material of the first transparent layer and a material of the additional layer are each a fluoropolymer material.

2. The module according to claim 1, wherein said at least one pre-preg-type composite material has a polymeric resin impregnation rate between 30 and 70 mass %.

3. The module according to claim 1, wherein said at least one material composite of the second layer is a polymeric resin and fibers based pre-preg, the polymer being selected from polyester, epoxy, and/or acrylic, and the fibers being selected from glass, carbon, and/or aramid fibers.

4. The module according to claim 1, wherein the module has a weight per unit area lower than 1 kg/m$^2$.

5. The module according to claim 1, wherein the encapsulant assembly has a maximum thickness between 20 µm and 100 µm.

6. The module according to claim 1, wherein the encapsulant assembly is formed by at least one layer comprising at least one polymer type encapsulation material selected from: acid copolymers, ionomers, poly(ethylene-vinyl acetate), vinyl acetals, polyvinylbutyrals, polyurethanes, polyvinyl chlorides, polyethylenes, low density linear polyethylenes, copolymer elastomer polyolefins, α-olefin and α,β-ethylenic carboxylic acid ester copolymers, ethylene-methyl acrylate copolymers, ethylene-butyl acrylate copolymers, silicone elastomers, and epoxy resins.

7. The module according to claim 1, wherein the photovoltaic cells are selected from: single crystal-based or multi crystalline-based homojunction or heterojunction photovoltaic cells, IBC-type photovoltaic cells, and photovoltaic cells comprising at least one material from amorphous silicon, microcrystalline silicon, cadmium telluride, copper-indium selenide and copper-indium/gallium diselenide.

8. The module according to claim 1, wherein the photovoltaic cells have a thickness between 1 and 300 μm.

9. The module according to claim 1, wherein the additional layer consists of the same material as that making up the first layer forming the front face of the photovoltaic module, the material being ethylene chlorotrifluoroethylene.

10. A method for making a photovoltaic module according to claim 1, the method comprising:
hot laminating the constituent layers of the photovoltaic module, at a temperature between 130° C. and 170° C., for a time period of the lamination cycle of at least 10 minutes.

11. The method according to claim 10, further comprising laminating the constituent layers of the photovoltaic module between two anti-adhesive damping layers.

\* \* \* \* \*